(12) United States Patent
Yamamoto et al.

(10) Patent No.: US 6,347,655 B1
(45) Date of Patent: Feb. 19, 2002

(54) DIE BONDING DEVICE AND SEMICONDUCTOR DEVICE

(75) Inventors: Masahiko Yamamoto; Masahiro Ishitsuka; Toshio Komemura, all of Tokyo (JP)

(73) Assignees: Mitsubishi Denki Kabushiki Kaisha; Mitsubishi Electric Engineering Co., Ltd., both of Tokyo (JP)

( * ) Notice: Subject to any disclaimer, the term of this patent is extended or adjusted under 35 U.S.C. 154(b) by 0 days.

(21) Appl. No.: 09/548,964

(22) Filed: Apr. 13, 2000

(30) Foreign Application Priority Data

Nov. 2, 1999 (JP) .......................................... 11-312420

(51) Int. Cl.$^7$ .............................................. B32B 31/00
(52) U.S. Cl. ..................... 156/540; 156/580; 156/583.1
(58) Field of Search .................................. 156/230, 235, 156/238, 311, 312, 499, 538, 539, 540, 555, 580, 581, 582, 583.1

(56) References Cited

U.S. PATENT DOCUMENTS 4,913,763 A * 4/1990 Yamazaki et al. .......... 156/358
5,961,768 A * 10/1999 Tsujimoto ................... 156/285
5,988,481 A * 11/1999 Torihata et al. ............ 228/49.5
6,238,515 B1 * 5/2001 Tsujimoto et al. ....... 156/379.8

FOREIGN PATENT DOCUMENTS

JP 64-41230 * 2/1989 ................. 156/538
JP 4-79339 * 3/1992 ............... 156/583.5

* cited by examiner

Primary Examiner—James Sells
(74) Attorney, Agent, or Firm—Oblon, Spivak, McClelland, Maier & Neustadt, P.C.

(57) ABSTRACT

A strap-like layered resin film (4) having the same width as a semiconductor chip (2) is cut out from a layered resin film (4F) and pressurized while being heated to the temperature below the transition temperature of a resin ribbon (4b), to be bonded onto a predetermined region (1R) of a lead frame (1). Subsequently, removing a cover ribbon (4a) of non-stickiness from the film (4), the semiconductor chip (2) is bonded to the predetermined region (1R) with the resin ribbon (4b) of stickiness heated to about the transition temperature, and further pressurized. With this structure, in bonding the lead frame and the semiconductor chip with the resin film as a bonding material, it is possible to prevent emergence of a void caused by sucking air and extending-off of the bonding material.

19 Claims, 8 Drawing Sheets

F I G. 8
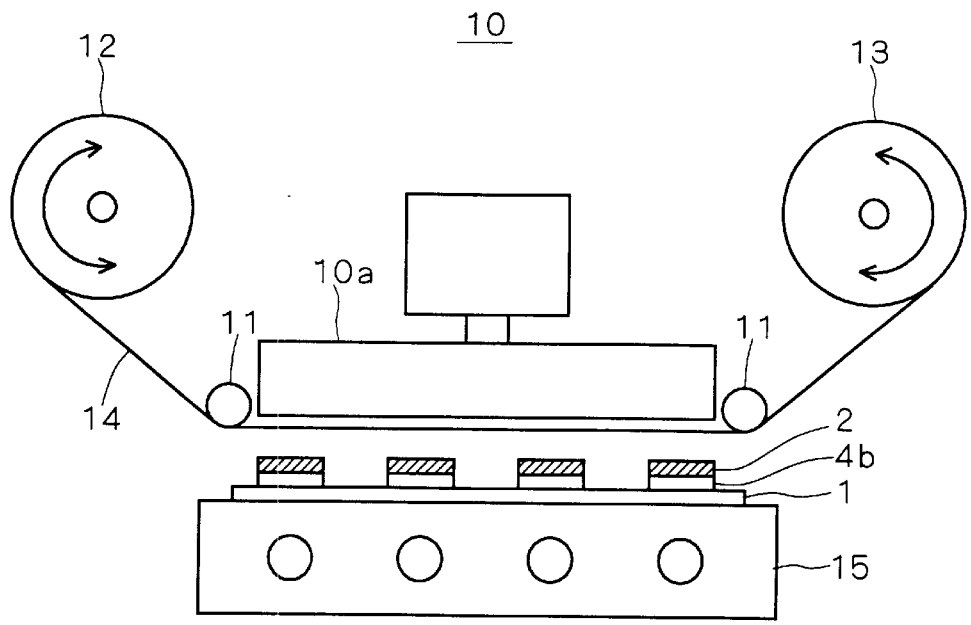
F I G. 9
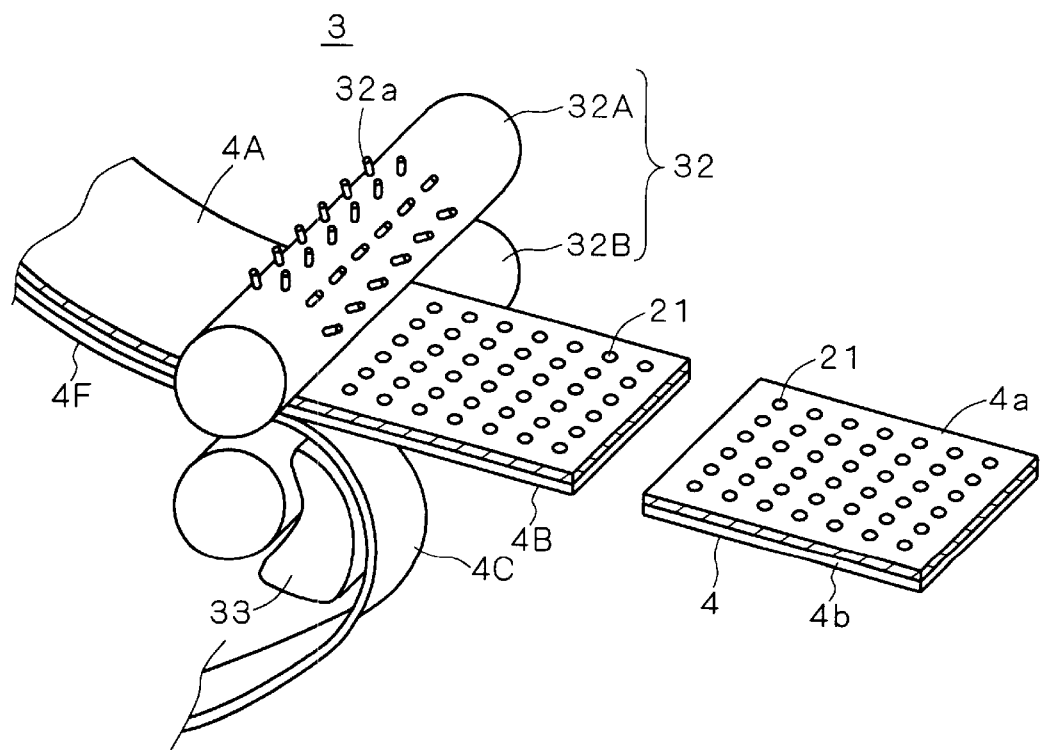

DIE BONDING DEVICE AND SEMICONDUCTOR DEVICE

BACKGROUND OF THE INVENTION

1. Field of the Invention

The present invention relates to a technique to perform die bonding of a semiconductor chip on a lead frame of a semiconductor device with a resin film used as a bonding material.

2. Description of the Background Art

FIGS. 10 and 11 are process diagrams schematically showing a method of bonding a semiconductor chip and a lead frame in a prior-art die bonding device. In both figures, reference numeral 110 denotes a dispenser head, numeral 111 denotes a resin paste, numeral 1 denotes a lead frame for semiconductor device (hereinafter, simply referred to as lead frame) and numeral 2 denotes a semiconductor chip (hereinafter, simply referred to as chip).

First, a transport device (not shown) and a positioning device (not shown) for the lead frame provided in the prior-art die bonding device positions the lead frame 1 at a required position and then the dispenser head 110 guided in a transportable manner above a predetermined region in a bonding pad of the lead frame 1 applies an appropriate amount of resin paste 111 onto the predetermined region (see FIG. 10).

Next, a chip transfer head (not shown) places the chip 2 on the resin paste 111 applied on the lead frame 1 and applies a required load onto the chip 2 to evenly spread the resin paste 111 between a lower surface of the chip 2 and an upper surface of the lead frame 1, thereby temporarily bonding the chip 2 and the lead frame 1 (see FIG. 11). Then, by the above bonding method, similarly, a plurality of chips 2 are temporarily bonded on the lead frame 1.

After that, for each lead frame 1, the resin paste 111 is dried in a later curing process to completely bond the chips 2 on the lead frame 1.

Since the prior-art die bonding device has a constitution for bonding the chip and the lead frame by application of the resin paste, the following roughly-divided two problems (1) and (2) arise.

(1) The first problem lies in that the prior-art bonding method has high probability of creating a void 120 by sucking air into the resin paste 111, as illustrated in FIG. 12, at the same time when the required load is put on the resin paste 111 to evenly apply the paste 111 between the lower surface of the chip 2 and the upper surface of the lead frame 1 in temporary bonding of the chip 2 on the lead frame 1 with the resin paste 111 put therebetween. When the void 120 is produced and left inside the resin paste 111, the following ill effect may be caused after sealing the chip 2, inner lead portions (not shown) of the lead frame 1 and the like with a mold resin (not shown). Specifically, when the chip 2 and the like generate heat due to an operation of the semiconductor device, this heat generation raises the temperature of the resin 111 existing between the lower surface of the chip 2 and the upper surface of the lead frame 1. As a result, the void 120 (of FIG. 12) which is babble expands and it is worried that there arises an ill effect that the chip 2 is distorted or damaged by a stress due to this expansion. Further, it is also worried that the expansion force of the void 120 causes a crack in the peripheral mold resin which seals the chip 2 and the like, resulting in an imperfect sealing. Therefore, so long as such an ill effect is expected, there is great necessity of preventing the void 120 from appearing.

(2) The second problem is caused by that it is not sure in which direction the resin paste 111 (of FIG. 11) used in the prior art spreads when the load is applied from above through the chip 2, i.e., unevenness in spreading direction of the resin paste 111 on applying the load. Therefore, if the resin paste 111 spreads one-sidedly when the load is applied, as shown in FIG. 12, for example, there may arise a problem that an extending-off portion 112 of the resin paste 111 is developed on one side-surface side from the lower surface of the chip 2. This extending-off portion 112 also causes the following ill effect. (a) First arises a problem that a sealing region is reduced by the extending-off portion 112 and the thickness of the mold resin may be partially thinned depending on where the chip 2 having the extending-off portion 112 is placed. (b) Second, when the extending-off portion 112 rises up to near the surface of the chip 2, a wire (not shown) and the extending-off portion 112 may come into contact with each other in a wire bonding process for the chip 2. At this time, if the resin paste 111 is a pure insulative substance, no problem arises, but the resin paste 111 including silver, for example, is often used and in this case, the paste 111 and the wire become conducting. (c) Third, as shown in FIG. 12, a clearance 113 tends to appear on the other end side of the chip 2 and in a later sealing process, the mold resin enters the clearance 113 to weaken the bonding strength between the chip 2 and the lead frame 1, so that it is worried that the chip 2 tends to be removed off. (d) Additionally, as shown in FIG. 12, the chip 2 is not bonded in parallel to the surface of the lead frame 1 and like the case of (c), that weakens the bonding strength between the chip 2 and lead frame 1, and the mold resin layer over an upper surface of the chip 2 is thinned by the inclination of the chip 2, which may cause a problem in terms of hermeticity. Therefore, there is great necessity of preventing the extending-off portion 112 from appearing.

SUMMARY OF THE INVENTION

The present invention is directed to a die bonding device. According to a first aspect of the present invention, the die bonding device comprises: a supply unit configured to generate a strap-like resin film from a resin film having stickiness on its back surface and a predetermined thickness, the strap-like resin film having first and second widths in first and second directions, respectively, and the predetermined thickness; a transport unit configured to transport the strap-like resin film to a predetermined region in a surface of a lead frame to bring the back surface of the strap-like resin film into contact with the predetermined region; a heating unit configured to set the temperature of the strap-like resin film to be higher than the room temperature and below the transition temperature of the strap-like resin film; and a pressurizing unit having a pressing portion which is vertically movable, the pressurizing unit configured to pressurize the strap-like resin film from a surface thereof heated by the heating unit, with the pressing portion, to bond the back surface of the strap-like resin film to the predetermined region, and in the die bonding device of the first aspect, the predetermined region has the first and second widths in the first and second directions, respectively.

According to a second aspect of the present invention, in the die bonding device according to the first aspect, the resin film comprises a resin ribbon whose stickiness at the room temperature is lower than that at the transition temperature; and a cover ribbon layered on a surface of the resin ribbon and having a surface of non-stickiness, the strap-like resin film comprises a strap-like resin ribbon; and a strap-like cover ribbon layered on a surface of the strap-like resin ribbon, and the pressing portion of the pressurizing unit pressurizes a surface of the strap-like cover ribbon layered on the surface of the strap-like resin ribbon whose temperature is set to be higher than the room temperature and below the transition temperature of the strap-like resin ribbon, to bond a back surface of the strap-like resin ribbon to the predetermined region, and defining the transport unit, the heating unit, the pressurizing unit and the pressing portion as a first transport unit, a first heating unit, a first pressurizing unit and a first pressing portion, respectively, the die bonding device further comprises: a removing unit configured to remove only the strap-like cover ribbon included in the strap-like resin film in which the back surface of the strap-like resin ribbon is bonded to the predetermined region; a second heating unit configured to set the temperature of the strap-like resin ribbon in a predetermined temperature range including the transition temperature of the strap-like resin ribbon; a second transport unit configured to transport a semiconductor chip having the first and second widths in the first and second directions, respectively, onto the surface of the strap-like resin ribbon without the strap-like cover ribbon; and a second pressurizing unit having a second pressing portion which is vertically movable, the second pressurizing unit configured to pressurize the strap-like resin ribbon heated by the second heating unit and the semiconductor chip transported onto the surface of the strap-like resin ribbon from a surface of the semiconductor chip with the second pressing portion, to bond a back surface of the semiconductor chip to the surface of the strap-like resin ribbon.

According to a third aspect of the present invention, in the die bonding device according to the first aspect, the resin film is made of a resin ribbon whose stickiness at the room temperature is lower than that at the transition temperature, the strap-like resin film is made of a strap-like resin ribbon, and the pressing portion of the pressurizing unit has a pressing surface of non-stickiness and pressurizes a surface of the strap-like resin ribbon whose temperature is set to be higher than the room temperature and below the transition temperature of the strap-like resin ribbon by the heating unit, with the pressing surface interposed, to bond a back surface of the strap-like resin ribbon to the predetermined region.

According to a fourth aspect of the present invention, in the die bonding device according to the third aspect, defining the transport unit, the heating unit, the pressurizing unit and the pressing portion as a first transport unit, a first heating unit, a first pressurizing unit and a first pressing portion, respectively, the die bonding device further comprises: a second heating unit configured to set the temperature of the strap-like resin ribbon in a predetermined temperature range including the transition temperature of the strap-like resin ribbon; a second transport unit configured to transport a semiconductor chip having the first and second widths in the first and second directions, respectively, onto the surface of the strap-like resin ribbon; and a second pressurizing unit having a second pressing portion which is vertically movable, the second pressurizing unit configured to pressurize the strap-like resin ribbon heated by the second heating unit and the semiconductor chip transported onto the surface of the strap-like resin ribbon from a surface of the semiconductor chip with the second pressing portion, to bond a back surface of the semiconductor chip to the surface of the strap-like resin ribbon.

According to a fifth aspect of the present invention, in the die bonding device according to the second aspect, the second pressing portion of the second pressurizing unit has such shape and size as to collectively pressurize surfaces of a plurality of semiconductor chips each transported onto the surface of the strap-like resin ribbon corresponding thereto by the second transport unit.

According to a sixth aspect of the present invention, in the die bonding device according to the fifth aspect, the second pressurizing unit further comprises an interference material of non-stickiness, having a predetermined elastic force in a direction of thickness and provided between the position of the second pressing portion before pressurization and the surfaces of the plurality of semiconductor chips, and the second pressing portion of the second pressurizing unit pressurizes the surfaces of the plurality of semiconductor chips with the interference material interposed.

According to a seventh aspect of the present invention, in the die bonding device according to the fourth aspect, the second pressing portion of the second pressurizing unit has such shape and size as to collectively pressurize surfaces of a plurality of semiconductor chips each transported onto the surface of the strap-like resin ribbon corresponding thereto by the second transport unit.

According to an eighth aspect of the present invention, in the die bonding device according to the seventh aspect, the second pressurizing unit further comprises an interference material of non-stickiness, having a predetermined elastic force in a direction of thickness and provided between the position of the second pressing portion before pressurization and the surfaces of the plurality of semiconductor chips, and the second pressing portion of the second pressurizing unit pressurizes the surfaces of the plurality of semiconductor chips with the interference material interposed.

According to a ninth aspect of the present invention, in the die bonding device according to the second aspect, the removing unit has a flexible body having a first surface of stickiness and a second surface of non-stickiness opposed to the first surface, said flexible body provided above the strap-like ribbon, the removing unit configured to bend the flexible body to bond the first surface and the surface of the strap-like cover ribbon and forcedly return the bent flexible body to the initial position to remove the strap-like cover ribbon.

According to a tenth aspect of the present invention, in the die bonding device according to the first aspect, the supply unit comprises a pair of rollers configured to hold the resin film; and a blade portion positioned in a direction of sending the resin film through an operation of the pair of rollers, the blade portion configured to cut an edge portion of the resin film of a predetermined length sent through the operation of the pair of rollers to obtain the strap-like resin film, and at least one of the pair of rollers is a metal roller provided with a plurality of protrusion needles each having such a length as to reach a sticky portion of the resin film.

The present invention is also directed to a semiconductor device. According to an eleventh aspect of the present invention, the semiconductor device comprises: at least one semiconductor chip which is die-bonded onto the predetermined region by the die bonding device according to the second aspect.

The present invention is directed to a die bonding device again. According to a twelfth aspect of the present invention, the die bonding device comprises: supply means for generating a strap-like resin film from a resin film having stickiness on its back surface and a predetermined thickness, the strap-like resin film having first and second widths in first and second directions, respectively, and the predetermined thickness; transport means for transporting the strap-like resin film to a predetermined region in a surface of a lead frame to bring the back surface of the strap-like resin film into contact with the predetermined region; heating means for setting the temperature of the strap-like resin film to be higher than the room temperature and below the transition temperature of the strap-like resin film; and pressurizing means having a pressing portion which is vertically movable, the pressurizing means for pressurizing the strap-like resin film from a surface thereof heated by the heating means, with the pressing portion, to bond the back surface of the strap-like resin film to the predetermined region, in the die bonding device of the twelfth aspect, the predetermined region has the first and second widths in the first and second directions, respectively.

According to a thirteenth aspect of the present invention, in the die bonding device according to the twelfth aspect, the resin film comprises a resin ribbon whose stickiness at the room temperature is lower than that at the transition temperature; and a cover ribbon layered on a surface of the resin ribbon and having a surface of non-stickiness, the strap-like resin film comprises a strap-like resin ribbon; and a strap-like cover ribbon layered on a surface of the strap-like resin ribbon, and the pressing portion of the pressurizing means pressurizes a surface of the strap-like cover ribbon layered on the surface of the strap-like resin ribbon whose temperature is set to be higher than the room temperature and below the transition temperature of the strap-like resin ribbon, to bond a back surface of the strap-like resin ribbon to the predetermined region, and defining the transport means, the heating means, the pressurizing means and the pressing portion as first transport means, first heating means, first pressurizing means and a first pressing portion, respectively, the die bonding device further comprises: removing means for removing only the strap-like cover ribbon included in the strap-like resin film in which the back surface of the strap-like resin ribbon is bonded to the predetermined region; second heating means for setting the temperature of the strap-like resin ribbon in a predetermined temperature range including the transition temperature of the strap-like resin ribbon; second transport means for transporting a semiconductor chip having the first and second widths in the first and second directions, respectively, onto the surface of the strap-like resin ribbon without the strap-like cover ribbon; and second pressurizing means having a second pressing portion which is vertically movable, the second pressurizing means for pressurizing the strap-like resin ribbon heated by the second heating means and the semiconductor chip transported onto the surface of the strap-like resin ribbon from a surface of the semiconductor chip with the second pressing portion, to bond a back surface of the semiconductor chip to the surface of the strap-like resin ribbon.

According to a fourteenth aspect of the present invention, in the die bonding device according to the twelfth aspect, the resin film is made of a resin ribbon whose stickiness at the room temperature is lower than that at the transition temperature, the strap-like resin film is made of a strap-like resin ribbon, and the pressing portion of the pressurizing means has a pressing surface of non-stickiness and pressurizes a surface of the strap-like resin ribbon whose temperature is set to be higher than the room temperature and below the transition temperature of the strap-like resin ribbon by the heating means, with the pressing surface interposed, to bond a back surface of the strap-like resin ribbon to the predetermined region.

According to a fifteenth aspect of the present invention, in the die bonding device according to the fourteenth aspect, defining the transport means, the heating means, the pressurizing means and the pressing portion as first transport means, first heating means, first pressurizing means and a first pressing portion, respectively, the die bonding device further comprises: second heating means for setting the temperature of the strap-like resin ribbon in a predetermined temperature range including the transition temperature of the strap-like resin ribbon; second transport means for transporting a semiconductor chip having the first and second widths in the first and second directions, respectively, onto the surface of the strap-like resin ribbon; and second pressurizing means having a second pressing portion which is vertically movable, the second pressurizing means for pressurizing the strap-like resin ribbon heated by the second heating means and the semiconductor chip transported onto the surface of the strap-like resin ribbon from a surface of the semiconductor chip with the second pressing portion, to bond a back surface of the semiconductor chip to the surface of the strap-like resin ribbon.

According to a sixteenth aspect of the present invention, in the die bonding device according to the thirteenth aspect, the second pressing portion of the second pressurizing means has such shape and size as to collectively pressurize surfaces of a plurality of semiconductor chips each transported onto the surface of the strap-like resin ribbon corresponding thereto by the second transport means.

According to a seventeenth aspect of the present invention, in the die bonding device according to the sixteenth aspect, the second pressurizing means further comprises an interference material of non-stickiness, having a predetermined elastic force in a direction of thickness and provided between the position of the second pressing portion before pressurization and the surfaces of the plurality of semiconductor chips, and the second pressing portion of the second pressurizing means pressurizes the surfaces of the plurality of semiconductor chips with the interference material interposed.

According to an eighteenth aspect of the present invention, in the die bonding device according to the fifteenth aspect, the second pressing portion of the second pressurizing means has such shape and size as to collectively pressurize surfaces of a plurality of semiconductor chips each transported onto the surface of the strap-like resin ribbon corresponding thereto by the second transport means.

According to a nineteenth aspect of the present invention, in the die bonding device according to the eighteenth aspect, the second pressurizing means further comprises an interference material of non-stickiness, having a predetermined elastic force in a direction of thickness and provided between the position of the second pressing portion before pressurization and the surfaces of the plurality of semiconductor chips, and the second pressing portion of the second pressurizing means pressurizes the surfaces of the plurality of semiconductor chips with the interference material interposed.

According to a twentieth aspect of the present invention, in the die bonding device according to the thirteenth aspect, the removing means has a flexible body having a first surface of stickiness and a second surface of non-stickiness opposed to the first surface, said flexible body provided above the strap-like ribbon, the removing means for bending the flexible body to bond the first surface and the surface of the strap-like cover ribbon and forcedly return the bent flexible body to the initial position to remove the strap-like cover ribbon.

(1) In accordance with the first and twelfth aspects of the present invention, in bonding the strap-like resin film to the lead frame, it is advantageously possible to stably and reliably bond the back surface of the film to the predetermined region while preventing the film from extending off from the predetermined region of the lead frame and moreover pushing out a void which is mixed in the film to remove it from the film to thereby sufficiently suppress emergence of the void and its remainder.

(2) In accordance with the second and thirteenth aspects of the present invention, it is possible to effectively prevent a situation where the strap-like resin ribbon extends off from the predetermined region to attach to side surfaces of the semiconductor chip to even the ribbon in thickness and completely prevent the void from remaining in the strap-like resin ribbon, and as a result the semiconductor chip can be stably and reliably bonded onto the predetermined region, whereby a desired bonding strength can be obtained between the semiconductor chip and the strap-like resin ribbon and between the ribbon and the predetermined region.

Moreover, the above aspects of the present invention produce an effect that the pressing portion of the pressurizing unit can bond the back surface of the strap-like resin ribbon to the predetermined region with the cover ribbon not bonded thereto.

(3) In accordance with the third and fourteenth aspects of the present invention, an effect that the pressing portion of the pressurizing unit can effectively pressurize the strap-like resin ribbon without being bonded to the ribbon even when the resin film is made of the resin ribbon.

(4) In accordance with the fourth and fifteenth aspects of the present invention, it is possible to effectively prevent a situation where the strap-like resin ribbon extends off from the predetermined region to attach to the side surfaces of the semiconductor chip to even the ribbon in thickness and completely prevent the void from remaining in the strap-like resin ribbon, and as a result the semiconductor chip can be stably and reliably bonded onto the predetermined region, whereby a desired bonding strength can be obtained between the semiconductor chip and the strap-like resin ribbon and between the ribbon and the predetermined region even when the resin film is made of the resin ribbon.

(5) The fifth, seventh, sixteenth and eighteenth aspects of the present invention can remarkably improve the performance of the die bonding device.

(6) In accordance with the sixth, eighth, seventeenth and nineteenth aspects of the present invention, since pressure is indirectly applied with the interference material interposed, without any influence of variation in thicknesses of the plurality of semiconductor chips if there is, it is possible to stably and reliably pressurize the plurality of semiconductor chips in a collective manner and reliably protect the respective surfaces of the plurality of semiconductor chips.

(7) The ninth and twentieth aspects of the present invention can reliably and easily remove the strap-like cover ribbon.

(8) In accordance with the tenth aspect of the present invention, since a microscopic hole corresponding to the diameter of a protrusion needle which can reach the sticky portion of the resin film is formed in the film on the stage of sending the film off, the microscopic hole provides an out of the void mixed in the strap-like resin film, to thereby push much more void out.

(9) The eleventh aspect of the present invention realizes a semiconductor device of excellent characteristics and quality, with no problem caused by extending-off of the die bonding material or bonding material, or the void remaining inside the material.

An object of the present invention is to a die bonding technique to completely prevent extending-off of the resin paste and emergence of a void and enhance the bonding strength between a chip and a lead frame by interposing a resin film evenly spreading between a lower surface of the chip and an upper surface of the lead frame.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a cross section showing a characteristic part of a die bonding device in accordance with a second preferred embodiment;

FIG. 9 is a perspective view showing a characteristic part of a die bonding device in accordance with a third preferred embodiment;

DESCRIPTION OF THE PREFERRED EMBODIMENTS (The First Preferred Embodiment)

In this preferred embodiment, discussion will be made on a constitution of a die bonding device and a method of manufacturing a semiconductor device using this device in a case where a multilayered resin film is used as "a resin film having stickiness on its back surface". In this case, as discussed later, a resin ribbon included in the multilayered resin film serves as a bonding material or a die bonding material between a semiconductor chip and a predetermined region in a die pad of a lead frame.

Figure 1:
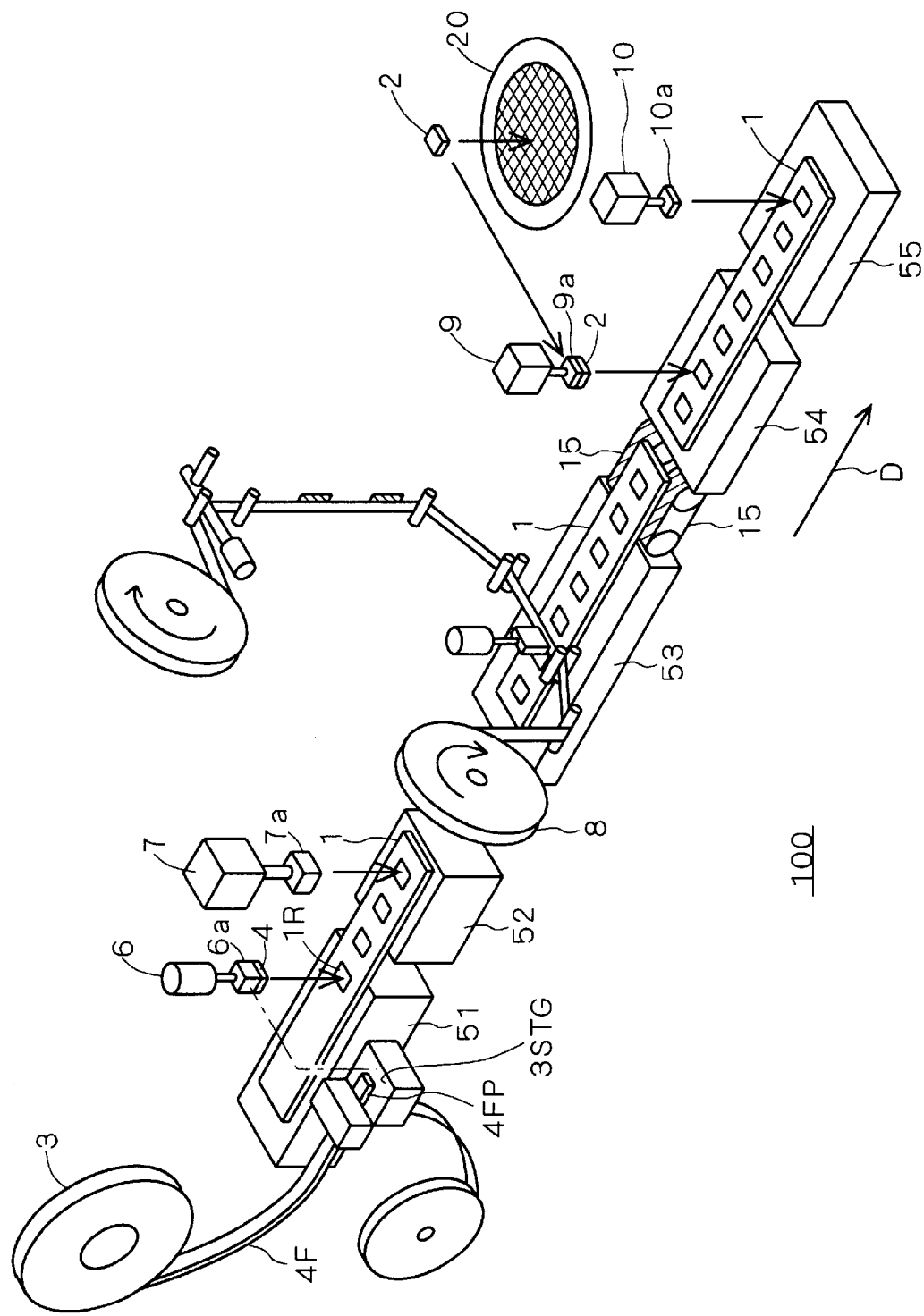
FIG. 1 is a perspective view schematically showing a die bonding device in accordance with a first preferred embodiment of the present invention.

FIG. 1 is a perspective view schematically showing an overall structure of a die bonding device 100. In this figure, representation of reference signs is as follows. Specifically, reference numeral 1 denotes a lead frame, numeral 2 denotes a semiconductor chip (hereinafter, simply referred to as chip) having a predetermined thickness and first and second widths in first and second directions, respectively, reference sign 1R denotes a predetermined region in a surface of a die pad of the lead frame 1, having the first and second widths in the first and second directions, respectively. Reference numeral 3 denotes a layered-resin-film supply unit for generating a strap-like layered resin film from a layered resin film, reference sign 4F denotes a layered resin film having the same width as the second width in the second direction, numeral 4 denotes a strap-like layered resin film having the first and second widths in the first and second directions and numerals 51 to 55 denote first to fifth heaters, respectively, which are generally termed a heater 5. Reference numeral 6 denotes a strap-like layered-resin-film transport unit (a first transporter) serving both as a first transport unit for precisely transport the strap-like layered resin film 4 placed on a stage 3STG onto the predetermined region 1R corresponding thereto by vacuum suction with a vacuum head 6*a* and as a first bonding unit for bonding the film 4 placed on the predetermined region 1R by pressurization through the vacuum head 6*a*. Reference numeral 7 denotes a strap-like layered-resin-film pressurizing unit or a first pressurizer for pressurizing the bonded strap-like layered resin film 4 transported onto the second heater 52 with a pressing portion 7*a* and numeral 8 denotes a cover-ribbon removing unit. Reference numeral 9 denotes a chip bonding unit (a second transporter) having a function as a second transport unit for taking the semiconductor chip 2 to be die-bonded by a vacuum head 9*a* which can perform vacuum suction out from a semiconductor wafer 20 and transporting the chip 2 onto a surface of a strap-like resin ribbon on the lead frame 1 transported onto the fourth heater 54 and a function of bonding the chip 2 onto the surface of the strap-like resin ribbon by using the vacuum head 9*a* as a pressing portion. Reference numeral 10 denotes a chip pressurizing unit or a second pressurizer for bonding the chip 2 onto the predetermined region 1R with the strap-like resin ribbon interposed therebetween by pressuring the surface of the bonded chip 2 with a pressing portion 10*a*. Reference numeral 15 denotes a transport mechanism which is a constituent of a lead frame transport device, and a belt-conveyer-type one contactable with both ends of the lead frame 1 is used herein but used may be other well-known-type ones such as a type to transport the lead frame 1 while vertically holding both ends thereof. Further, the transport mechanism 15 is provided between the heaters 5 and its operation is controlled by a controller (not shown). Reference character D indicates a direction of transporting the lead frame 1.

Figure 2:
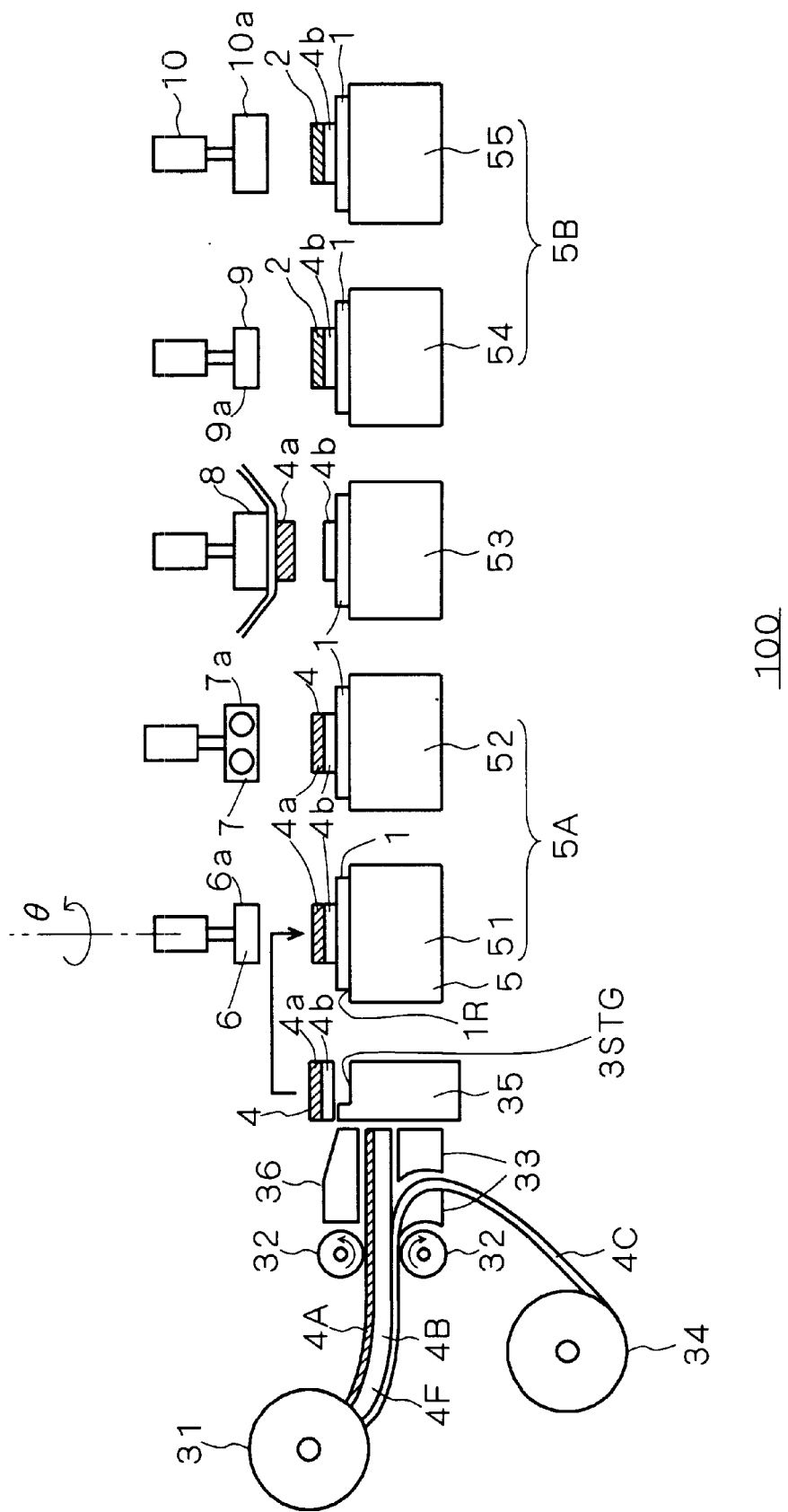
FIGS. 2 and 3 are views each showing a detailed constitution of the die bonding device of FIG. 1.

FIG. 2 shows a more detailed constitution of the present bonding device of FIG. 1 and a flaw of a bonding process for the semiconductor chip 2. Detailed discussion will be made below on functions of constituent elements, referring to FIG. 2.

The layered resin film 4F used as a base of the bonding material initially has a triple-layered structure and the film 4F is changed into a double-layered structure in a process of generating the strap-like layered resin film 4. In this stage, the layered resin film 4F (of double-layered structure) corresponds to "a resin film having a stickiness on its back surface and a predetermined thickness." Its constitution will be discussed below in detail.

As shown in FIG. 2, a core portion of the layered resin film 4F is made of a resin ribbon 4B having a characteristic feature of low stickiness at room temperature, that is, the stickiness at the room temperature sufficiently lower than that at glass transition temperature (simply referred to as transition temperature). Herein, as one example, a ribbon whose transition temperature is about 180° C. is used as the ribbon 4B and has a thickness in a range of e.g., 30 $\mu$m to 200 $\mu$m, in other words, is a thin film. On an upper surface of the ribbon 4B layered is a cover ribbon 4A having non-stickiness on its surface and covering the whole upper surface of the resin ribbon 4B. The ribbon 4A has a thickness of e.g., 100 $\mu$m and almost the same hardness as plastics. Further, on a lower surface or back surface of the resin ribbon 4B, a winding ribbon 4C covering the whole lower surface of the ribbon 4B is layered or attached. The ribbon 4C is a sheet-like one and made of a very soft material. The adhesive strength between the winding ribbon 4C and the resin ribbon 4B is such that the ribbon 4C can be removed by human hand. The width of the layered resin film 4F of triple-layered structure in the second direction, i.e., the width in the direction perpendicular to this paper of FIG. 2, is set in advance to be equal to the second width of the chip 2. Naturally, it is not necessary to set the width of the film 4F in the second direction to be equal to the second width of the chip 2 from the beginning, and the width of the film 4F in the second direction may be cut to be equal to the second width of the chip 2 with a blade portion as discussed later.

Figure 3:
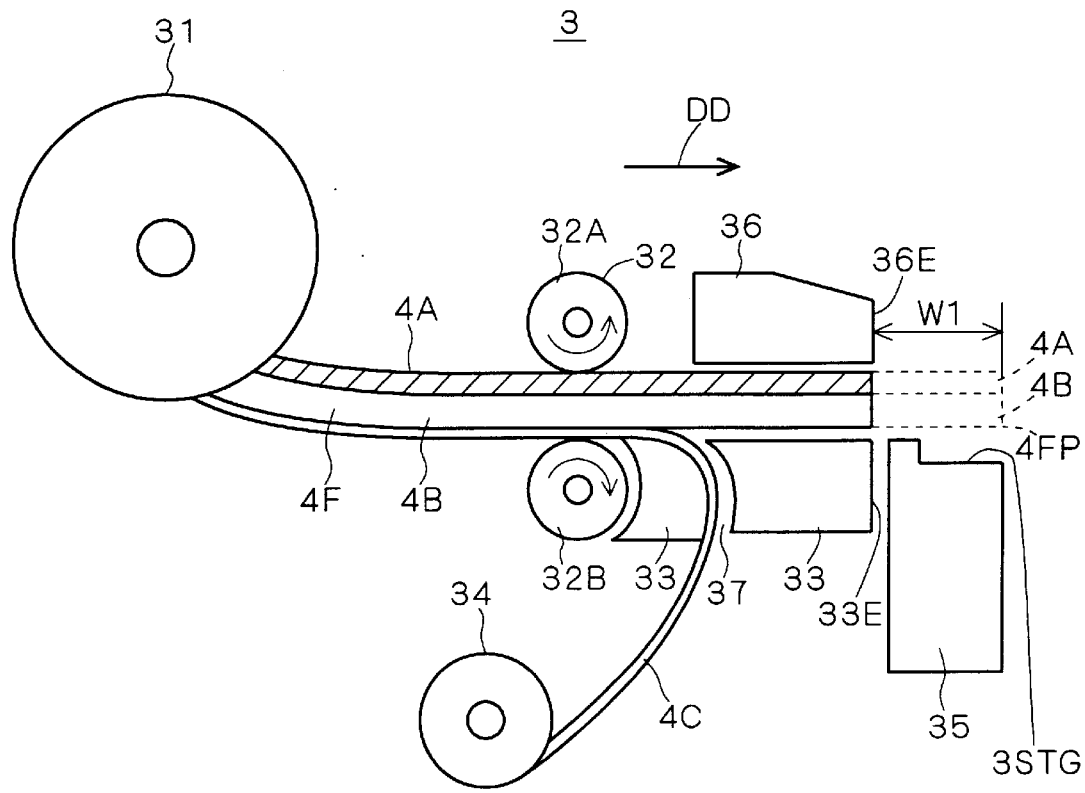

A layered-resin-film supply unit 3 of FIG. 1 is enlarged in a longitudinal section of FIG. 3, to show its constitution and operation. As shown in this figure, the unit 3 consists of (1) a supply reel 31 holding the layered resin film 4F of triple-layered structure wound in a form of reel, (2) a pair of rollers 32 vertically holding the layered resin film 4F of triple-layered structure to send the film 4F in a sending direction DD, (3) a winding guide 33 of block-like shape disposed immediately near a roller 32B on the lower side of the pair of rollers 32 with respect to the sending direction DD and provided with a curvature clearance 37 that can pass only the winding ribbon 4C through, (4) an upper blade 36 (a first blade) disposed behind a roller 32A on an upper side of the pair of rollers 32 with respect to the sending direction DD so that its back surface opposed to a surface of the cover ribbon 4A may be opposed to an upper surface of part of the winding guide 33, (5) a lower blade 35 (a second blade) disposed a little away from the position of an end portion 33E of the winding guide 33 in the sending direction DD so that a point of the blade may be located at the same position as an upper surface of the winding guide 33 in not-cutting as shown in FIG. 3, being vertically movable by means of a driving mechanism (not shown) such as a motor in cutting the layered resin film 4F, and (6) a winding reel 34 having a central axis to which a motor (not shown) is connected, which can wind the winding ribbon 4C in a reel-like manner by a torque of the motor. The upper blade 36 and the lower blade 35 constitute "a blade portion for cutting a tip portion 4FP of the resin film 4F (4A, 4B) of a predetermined size W1 sent along the sending direction DD through an operation of the pair of rollers 32". The operation of the supply unit 3 of FIG. 3 will be discussed below in detail.

First, an operator draws the layered resin film 4F from the supply reel 31 on which the film 4F is wound in a reel-like manner and inserts the film 4F between the pair of rollers 32. Then, the operator peels off only the winding ribbon 4C from its tip portion and winds the peeled portion of the winding ribbon 4C around the winding reel 34 through the curvature clearance 37 while guiding the tip portion of the layered resin film 4F of double-layered structure consisting of the resin ribbon 4B and the cover ribbon 4A with the winding ribbon 4C peeled off in the sending direction DD with the pair of rollers 32 which roller-feed the film 4F by a required holding force to introduce the tip portion to a spatial position immediately below an edge portion 36E of the upper blade 36 and immediately above an end portion 33E of the winding guide 33. At this time, the tip portion of the peeled-off winding ribbon 4C is wound once around the winding reel 34 and thereafter the winding ribbon 4C is freely wound around the winding reel 34 consecutively by a torque of the motor of the reel 34 operating in response to the roller feed of the pair of rollers 32.

Figure 4:
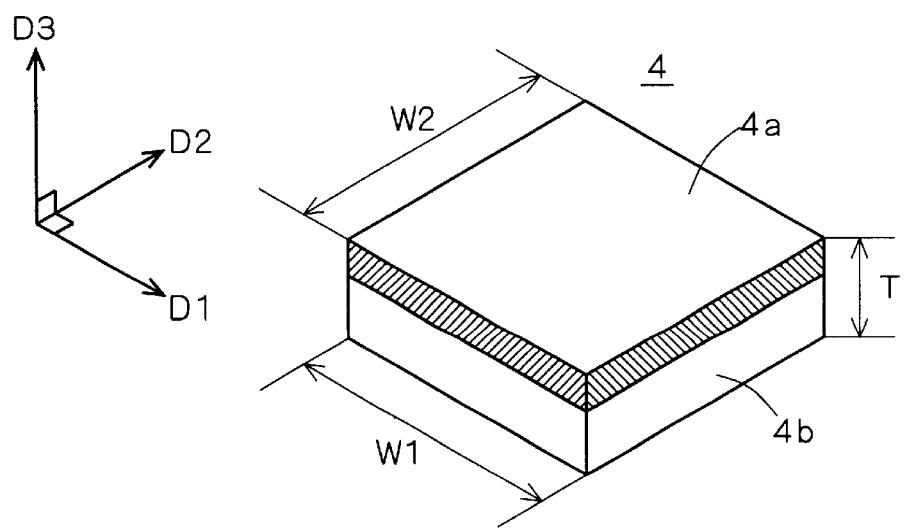
FIG. 4 is a perspective view showing a cut-off strap-like layered resin film.

In this condition, the operator drives the pair of rollers 32 by a certain amount. Through such roller feed of the pair of rollers 32, the tip portion 4FP of the layered resin film 4F consisting of the resin ribbon 4B and the cover ribbon 4A is reeled out from the positions of the edge portion 36E and the end portion 33E along the sending direction DD by the predetermined amount W1. After that, the operator controls the activation of the lower blade 35 which is vertically movable. As a result, through a cutting operation by the upper blade 36 and the lower blade 35, the strap-like layered resin film 4 of FIG. 4 is cut off. At this time, since the predetermined amount W1 is set to be equal to the first width of the semiconductor chip 2 and the predetermined region 1R in the first direction, the film 4 gets first and second widths W1 and W2 in first and second directions D1 and D2, respectively, and a predetermined thickness T in a third direction D3. The strap-like layered resin film 4 (4a and 4b) is placed on the stage 3STG of the lower blade 35 after being cut. Referring back to FIGS. 1 and 2, discussion will be made below.

As shown in FIGS. 1 and 2, the transport device and the positioning device (not shown) for the lead frame 1 (hereinafter, the two devices are together referred to simply as transport and positioning device) transport the predetermined region 1R of the lead frame 1 to be die-bonded to a predetermined position of the first heater 51 to position it on that position. Herein, the first heater 51 heats the predetermined region 1R of the lead frame 1 so that the region 1R may become higher than the room temperature and lower than the glass transition temperature of the strap-like layered resin film 4, i.e., the glass transition temperature of the strap-like resin ribbon 4b. In other words, as the heating temperature, a value needed to change the stickiness of the ribbon 4b from low to middle is set, e.g., in a range from 100° C. to 120° C. The strap-like layered-resin-film transport unit 6 transports the strap-like layered resin film 4 placed on the stage 3STG onto the predetermined region 1R of the lead frame 1 heated up to the temperature of the above range, and bonds the film 4 thereto. Specifically, the vacuum head or pressing portion 6a of the transport unit 6 moves up to above the strap-like layered resin film 4 after being cut and moves down to come into contact with the surface of the cover ribbon 4a (which corresponds to an upper surface of the film 4). Through operation of a vacuum pump (not shown) connected to the head 6a, the head 6a sucks the strap-like layered resin film 4 under vacuum, moves up once while keeping in this state and transports the film 4 to above the predetermined region 1R to place it precisely on the region 1R. The vacuum head 6a of the transport unit 6 is rotatable by an angle θ (90° maximum) about its central axis and thereby the first and second directions D1 and D2 of the strap-like layered resin film 4 immediately after being cut and the first and second directions of the predetermined region 1R on which the film 4 is to be placed can coincide with each other even if the first and second directions of the film 4 and the predetermined region 1R are different, respectively.

The temperature of the strap-like layered resin film 4 (4a+4b) placed precisely on the predetermined region 1R is immediately raised from the room temperature to almost the same temperature as that of the predetermined region 1R by thermal conduction. The strap-like resin ribbon 4b thereby comes into a soft state, being softer than at the room temperature, and its stickiness changes into an almost middle state. During this change, in other words, immediately after the film 4 is placed, the vacuum head 6a applies a predetermined load to the strap-like layered resin film 4. In this bonding operation, the applied load and the application time depend on the temperature of the strap-like resin ribbon 4b. At this time, since too large applied pressure causes too much extending-off of the strap-like resin ribbon 4b from the predetermined region 1R, avoiding such a condition, it is necessary to appropriately set the load to be applied. Therefore, according to the heating temperature, the predetermined load and the predetermined application time have only to be appropriately set to such an extent that the load should not be extremely large. In this case, when the load is relatively large, the application time becomes shorter and when the load is relatively small, the application time becomes longer.

As one example, when the first and second widths of the semiconductor chip 2 and the predetermined region 1R are each 1 mm, the load is 9.8 N and the application time is about 1 second. After applying the load, the vacuum between the vacuum head 6a and the upper surface of the film 4 is released and the head 6a goes up.

Such a temporary attachment of the strap-like layered resin film 4 can produce the following effects.

Specifically, since (1) the first and second widths W1 and W2 of the strap-like layered resin film 4 are set to be equal to the sizes in the first and second directions of the semiconductor chip 2 and the predetermined region 1R, (2) even when the thickness of the strap-like resin ribbon 4b is set at 50 μm or 100 μm, for example, the film 4 has a thickness T of 150 μm or 200 μm, being a thin film, and moreover (3) the temperature of the film 4 is lower than the transition temperature of the strap-like resin ribbon 4b even though the film 4 is heated by the first heater 51, the film 4 does not come into a melted state, remaining in a soft state, in other words, the load is applied to the ribbon 4b to draw out the air or void inside the ribbon 4b without melting the ribbon 4b while the ribbon 4b is in a middle stickiness, even if the strap-like layered resin film 4 is bonded by the vacuum head 6a, (i) almost no part of the film 4 is extended off from the predetermined region 1R, and (ii) it is possible to reliably push out the void which is a bubble mixed in the strap-like resin ribbon 4b in bonding and sufficiently suppress the remainder of already-developed void to too little. Moreover, (iii) since the upper layer of the strap-like layered resin film 4 is the cover ribbon 4a of non-stickiness, it is advantageously possible to prevent a pressing surface (actually, the surface is coated with Teflon) of the vacuum head 6a from attaching to the strap-like resin ribbon 4b in bonding.

Next, the operator drives the transport and positioning device for the lead frame 1 and thereby the transport and positioning device sequentially shifts the strap-like layered resin film 4 temporarily attached to the lead frame 1 pitch by pitch (which generally corresponds to an interval for mounting a plurality of semiconductor chips provided on the lead frame 1) in a transporting direction D, transports the predetermined region 1R of the lead frame 1 on which the film 4 is temporarily attached to an upper surface of the next second heater 52 and positions it at this position. At this position, a first pressurizer 7 which is vertically movable is provided above the upper surface of the second heater 52 and has a cylinder (not shown) and a pressing portion 7a connected to a tip portion of a shaft of the cylinder. The temperature of the second heater 52 is set at the room temperature. Assuming that "heating" means "to raise the temperature of an object to be heated from the room temperature", the second heater 52 does not practically function as a heater for the lead frame 1, but in cooperation with the pressing portion 7a which is initially at the room temperature as well, it performs a function of cooling the strap-like layered resin film 4 heated to the temperature in a range from e.g., 100° C. to 120° C. in the preceding bonding. For the strap-like layered resin film 4 on the lead frame 1 placed on the upper surface of the second heater 52, being gradually cooled thus by the second heater 52, the second-stage pressurization as an afterpress or prime bonding is performed as follows.

When a pressing surface of the pressing portion 7a moves down to come into contact with a surface of the cover ribbon 4a, the first pressurizer 7 pressurizes the strap-like layered resin film 4 from its surface with a load larger than the load in bonding. Also in this case, though application of extremely-large load should be avoided, according to the temperature of the film 4 which is being cooled toward the room temperature but still higher than the room temperature, it is possible to appropriately set a predetermined load and a predetermined pressurization time. For example, when the first and second widths W1 and W2 are each 10 mm (the chip 2 of 10 mm×10 mm), the load and the pressurization time are set to 29.4 N and 1 second, respectively. After pressurization, the pressing portion 7a goes up.

The above pressurization produces the following effect.

In the present process, the strap-like resin ribbon 4b is being gradually cooled from a state of high temperature (e.g., 100° C. to 120° C.) below its transition temperature toward the room temperature. In other words, the ribbon 4b is being returned to a low-stickiness state from the middle-stickiness state, and in this state, the ribbon 4b is pressurized with the above load, with the cover ribbon 4a interposed. Therefore, a small void included inside the strap-like resin ribbon 4b is completely removed. Of course, in this case, the amount of strap-like resin ribbon 4b to extend off from the predetermined region 1R is suppressed to a negligible degree. Moreover, the pressing surface of the pressing portion 7a never attaches to the strap-like resin ribbon 4b and it is possible to stably remove the void from the bonding material.

Though it is herein assumed that (the load of the pressing portion 7a)>(the load of the vacuum head 6a), the relation of loads is not limited to this, and the loads may be set in a reverse relation. In the latter case, the strap-like resin ribbon 4b is strongly pressurized in the bonding stage and the load which the pressing portion 7a should apply is gradually weakened in the later pressurizing stage, to thereby completely bond the film 4 to the predetermined region 1R with neither extending-off of the strap-like layered resin film 4 from the predetermined region 1R nor remainder of the void inside the film 4.

As is clear from the above discussion, the first and second heaters 51 and 52 are considered to constitute "a first heating unit 5A" which controls the temperature of the strap-like layered resin film 4 to be a value in a range higher than the room temperature and below the transition temperature of the film 4, particularly the strap-like resin ribbon 4b. The first transporter 6 and the first pressurizer 7 can be considered to constitute "a first pressurizing unit" which pressurizes the strap-like layered resin film 4 whose temperature is controlled by heating with the first heating unit SA from its surface to bond the back surface of the film 4 to the predetermined region 1R.

Next, the operator drives the transport and positioning device for the lead frame 1 through automatic control, and the device transports the strap-like layered resin film 4 closely bonded onto the predetermined region 1R of the lead frame 1 with neither clearance nor void to above a predetermined position of an upper surface of the next third heater 53 and positions it there. The cover ribbon 4a covering the upper surface of the strap-like resin ribbon 4b positioned above an upper surface of the third heater 53 is thereby removed by the cover-ribbon removing unit 8. Specific constitution example and procedure of removing operation of the removing unit 8 will be discussed later. The temperature of the third heater 53 is set at the room temperature and the third heater 53 does not substantially perform a pressurizing function.

Next, the operator drives the transport and positioning device for the lead frame 1, and the device transports the predetermined region 1R of the lead frame 1 to which only the strap-like resin ribbon 4b whose surface is entirely exposed is bonded to a predetermined position of an upper surface of the fourth heater 54 and positions it there. Further, the operator moves the second transporter 9 which is movable to above the semiconductor wafer 20 and lowers the vacuum head 9a which is the tip portion connected to a shaft of a cylinder (not shown) of the unit 9 to suck the chip 2 to be die-bonded under vacuum. After that, the second transporter 9 moves to above the strap-like resin ribbon 4b transported and positioned to the upper surface of the third heater 53, and lowers the vacuum head 9a to place the chip 2 onto the surface of the strap-like resin ribbon 4b precisely bonded to the predetermined region 1R (at this time, the vacuum is released). The chip 2 is thereby precisely placed without extending off from the surface of the strap-like resin ribbon 4b. Further, the vacuum head 9a is rotatable around its axis by 90° maximum like the vacuum head 6a.

Herein, the second transporter 9 works not only as (1) a mechanism for transporting the chip 2 so that the back surface of the chip 2 and the front surface of the strap-like resin ribbon 4b may precisely coincide with each other but also as (2) a bonding device for bonding the chip 2 sucked under vacuum immediately after transportation. Therefore, the vacuum head 9a also works as a pressing portion.

Then, the vacuum head 9a of the second transporter 9 carries out the bonding process for the chip 2 immediately after placing the chip 2. In the bonding process, the fourth heater 54 is so set as to heat the lead frame 1 up to a temperature near and below the transition temperature of the strap-like resin ribbon 4b. Accordingly, in a shift to the bonding process for the chip 2, the strap-like resin ribbon 4b on the predetermined region 1R is heated up to almost the above temperature, and therefore the ribbon 4b is in a semi-molten state or a highly-softened state near high-stickiness and under this state, the ribbon 4b is pressurized with a predetermined load which is appropriately set according to the temperature for a predetermined time. Herein, since the strap-like resin ribbon 4b having the transition temperature of about 180° C. is chosen as an example, the heating temperature of the fourth heater 54 is set at about 160° C. In this state, the vacuum head 9a pressurizes the surface of the chip 2 sucked thereto under vacuum with the predetermined load for the predetermined time, to perform a temporary bonding between the back surface of the semiconductor chip 2 and the front surface of the strap-like resin ribbon 4b.

Though the load and pressurization time are appropriately set according to the temperature of the resin ribbon 4b as discussed above, it should be avoided to apply an extremely-large load in terms of prevention of the ribbon 4b and the chip 2 from being deformed. Herein, as an example, a load of 4.9 N is applied for 0.5 seconds. After completing this process, the vacuum suction between the vacuum head 9a and the chip 2 is released and the head 9a goes up.

It is obvious that this bonding process also produces the following function and effect. Specifically, since the surface area of the chip 2 and that of the strap-like resin ribbon 4b precisely coincide with each other, it is possible to control the amount of the ribbon 4b to extend off to a negligible degree in the bonding. Moreover, since the load is applied to the ribbon 4b in the semi-molten state, most of air mixed into the ribbon 4b when the chip 2 is bonded to the ribbon 4b is pushed out during the load application, and it is possible to suppress emergence of the void and its remainder inside the ribbon 4b to a minimum.

Next, the operator drives the transport and positioning device for the lead frame 1, and the device transports the predetermined region 1R of the lead frame 1 above which the chip 2 is bonded to a predetermined position of an upper surface of the fifth heater 55 and positions it there. At this position, the second pressurizer 10 which is vertically movable is provided, and the pressurizer 10 has a pressing portion 10a connected to the tip portion of a shaft of a cylinder (not shown). The temperature of the fifth heater 55 is set to be not lower than the transition temperature of the strap-like resin ribbon 4b and accordingly the ribbon 4b transported and positioned is also heated up to the temperature. Therefore, the ribbon 4b is in a completely-molten state and has become a resin film of high-stickiness. For example, the temperature of the fifth heater 55 is set to be a predetermined temperature not lower than 180° C. In this condition, the pressing portion 10a moves down and pressurizes the semiconductor chip 2 and the strap-like resin ribbon 4b from the upper surface of the chip 2 with a load larger than that with which the first pressurizer 7 pressurizes the ribbon 4b. For example, the load and pressurization time of this case are 9.8 N and 1 second when the first and second widths W1 and W2 are each 10 mm. After this process is completed, the pressing portion 10a goes up.

The afterpress or prime bonding by the second pressurizer 10 produces the following function and effect. Specifically, since the load is further applied to the strap-like resin ribbon 4b and the chip 2 when the ribbon 4b is in a highly-sticky state, the void mixed into the ribbon 4b and still left inside it is completely pushed out and the ribbon 4b is interposed between the chip 2 and the lead frame 1 evenly without extending off to the side-surface side of the chip 2, so that it is possible to obtain a bonding strength necessary and sufficient as a semiconductor device between the ribbon 4b and the chip 2 and between the ribbon 4b and the predetermined region 1R of the lead frame 1.

Even in the bonding and prime bonding processes for the chip 2, contrary to the above discussion, both the loads may be set so that the relation (the load by the vacuum head 9a)>(the load by the pressing portion 10a) may be true, and in this case, gradual reduction of the load by the pressing portion 10a can produce the above effect.

Further, though it is assumed herein that the relation [(the load by the second transporter 9)+(the load by the second pressurizer 10)]> [(the load by the first transporter 6)+(the load by the first pressurizer 7)] is true, this relation don't necessarily have to be true but the contrary relation is allowed.

From the above, the fourth and fifth heaters 54 and 55 can be generally referred to as "the second heating unit 5B" which sets the temperature of the strap-like resin ribbon 4b at about its transition temperature, in other words, at a temperature in a predetermined temperature range including the transition temperature. Moreover, the second transporter 9 and the second pressurizer 10 can be generally referred to as "the second pressurizer" which pressurizes the strap-like resin ribbon 4b having the temperature in the predetermined temperature range including its transition temperature and the chip 2 transported onto the surface of the ribbon 4b from the surface of the chip 2 to bond the front surface of the ribbon 4b and the back surface of the chip 2.

After bonding the chip 2 onto the predetermined region 1R of the lead frame 1 with the strap-like resin ribbon 4b interposed therebetween, other chips 2 are sequentially transported along the transporting direction D, to be die-bonded in the same manner.

After that, other circuit parts are die-bonded on the lead frame, and after performing a wire bonding process and the like, the chip 2, the inner lead portions of the lead frame 1 and the like are sealed with a mold resin by the transfer-mold method and further a process of cutting a tie bar portion of the lead frame 1 and other processes are performed, whereby the semiconductor device is completed.

Next, specific constitution and operation or function of the already-described cover-ribbon removing unit 8 will be discussed in detail referring to FIG. 5. The constitution of the cover-ribbon removing unit 8 is not limited to the following but various constitutions can be used as the removing unit 8 only if having a function of removing the cover ribbon 4a layered on the surface of the strap-like resin ribbon 4b.

Figure 5:
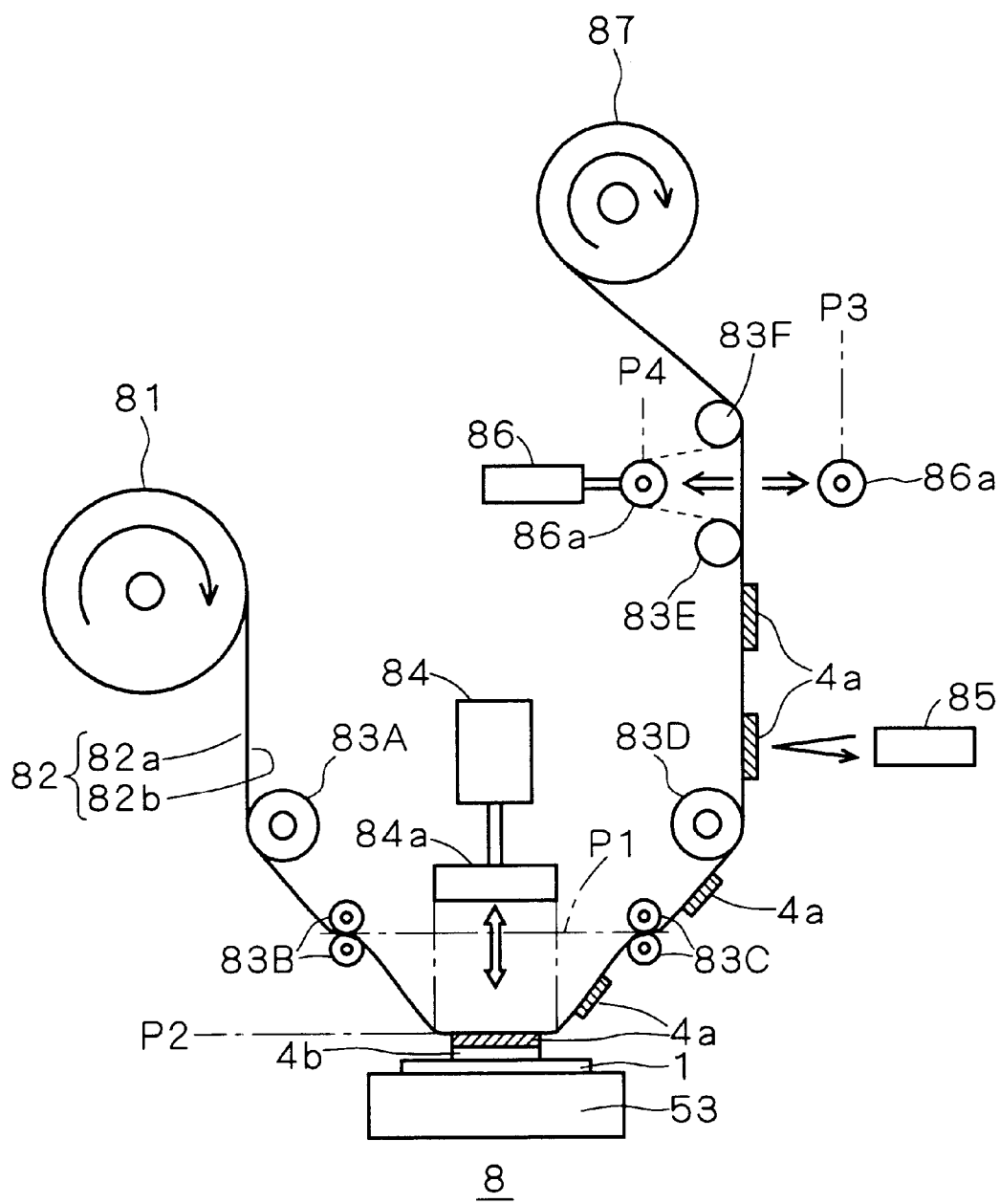
FIG. 5 is a cross section showing a constitution of a cover-ribbon removing unit in the die bonding device of FIG. 1.

In FIG. 5, reference numeral 82 denotes a sticky tape. A surface 82a of the tape 82 is a sticky surface (a first surface), and on the other hand, a back surface 82b of the tape 82 is a non-sticky surface (a second surface). Reference numeral 81 denotes a sticky-tape supply unit which is freely rotatable clockwise viewed from the upper side of the paper, around which the sticky tap 82 is wound, and the unit 81 rotates to send the tape 82 out when it receives a force to pull out the tape 82. On the other hand, reference numeral 87 denotes a sticky-tape ejection unit which rotates clockwise viewed from the upper side of the paper in response to the activation of a motor (not shown) to automatically reel the tape 82. Further, reference numerals 83A, 83B, 83C, 83D, 83E and 83F denote tape guides for guiding the sticky tape. Reference numeral 84 denotes a first sticky-tape pressurizing unit having a cylinder mechanism (not shown) therein, and a tip portion connected to a shaft of the cylinder is a pressurizing body 84a. Though the pressurizing body 84a is vertically movable by an operation of the cylinder mechanism, not in the removing process, it is positioned upper than a position P1 of this figure. Reference numeral 85 denotes a cover-ribbon detection device made of e.g., an infrared sensor, and when the strap-like cover ribbon 4a stuck to the sticky surface 82a is not detected on an ejection path for the sticky tape 82a, the detection device 85 sends a signal indicating non-detection to a controller (not shown) and the controller, receiving this signal, stops the activation of the motor of the sticky-tape ejection unit 87. Reference numeral 86 is a second sticky-tape pressurizing unit having e.g., a cylinder (not shown) therein, and at its tip portion of the cylinder shaft, which is positioned near the ejection path for the sticky tape 82 and can go beyond the ejection path when it protrudes most, formed is a round stick-like pressurizing guide 86a extending in a direction perpendicular to the paper of FIG. 5, as illustrated in FIG. 1.

The sticky tape (elastic or flexible material) 82 wound around the sticky-tape supply unit 81 is pulled out by human hand from the supply unit 81. Then, the sticky tape 82 is guided by the tape guides 83A to 83F through the position P1 at which the tape 82 exists before pressurization so that the sticky surface 82a may be opposed to the strap-like cover ribbon 4a layered on the upper surface of the strap-like resin ribbon 4b bonded to the predetermined region 1R of the lead frame 1 (see FIG. 1) at predetermined intervals between the tape guides 83B and 83C as shown in FIG. 5, and moreover its end portion is wound around the sticky-tape ejection unit 87. Further, the pressurizing body 84a moves down from a state where it is left above the cover ribbon 4a to come into contact with the non-sticky surface 82b and selectively pressurizes the non-sticky surface of the strap-like cover ribbon 4a through the sticky surface 82a, and after the ribbon 4a and the sticky surface 82a are bonded to each other, the pressurizing body 84a goes up. After the pressurizing body 84a moves upwards over the position P1, with the sticky-tape supply unit 81 and the sticky-tape ejection unit 87 being in a halt condition (where the motor of the ejection unit 87 is in a halt condition), the tip portion of the cylinder shaft of the second sticky-tape pressurizing unit 86 is retracted from a position P3 where it protrudes most and the pressurizing guide 86a comes into contact with the sticky surface 82a. The guide 86a pressurizes the sticky tape 82 while keeping contact therewith, to bend the tape 82 in a direction substantially perpendicular to the direction of the ejection path. As a result, the tape 82 is bent as indicated by a broken line of FIG. 5 and the pressurizing guide 86a is stopped at a position P4 of FIG. 5.

Next, a removing operation will be discussed in detail.

The sticky surface 82a of the sticky tape 82 having flexibility which is guided by the guides 83A and 83B and is tensed so as to be opposed at the position P1 to the upper surface of the strap-like cover ribbon 4a layered on the surface of the strap-like resin ribbon 4b bonded on the lead frame 1 transported and positioned to a predetermined position of the upper surface of the third heater 53 is pressurized by contact between the pressurizing surface of the pressurizing body 84a being descending and the non-sticky surface 82b, to be largely bent from the position P1 towards a position P2. At this time, the sticky tape 82 guided by the guides 83A and 83B is pulled out by a predetermined amount from the sticky-tape supply unit 81 according to the amount of bend of the sticky tape 82 caused by the pressurization of the pressurizing body 84a. At the same time, the pressurizing body 84a which keeps descending brings the sticky surface 82a of the sticky tape 82 into contact with the non-sticky surface of the strap-like cover ribbon 4a and pressurizes it. The non-sticky surface of the strap-like cover ribbon 4a and the sticky surface 82a of the sticky tape 82 are thereby bonded to each other. After that, the pressurizing body 84a goes up to the initial position.

It is necessary to select a material of the sticky tape 82 used to remove the strap-like cover ribbon 4a from the following standpoint. Specifically, since the third heater 53 is set at the room temperature herein, the strap-like resin ribbon 4b is also kept at the room temperature, and since the strap-like resin ribbon 4b is low-sticky at the room temperature, it is necessary to select a material having a stickiness slightly stronger than that of the strap-like resin ribbon 4b as the sticky tape 82. Using the sticky tape 82 which satisfies this condition, as the bonding strength between the sticky surface 82a and the upper surface of the strap-like cover ribbon 4a is stronger than that between the upper surface of the strap-like resin ribbon 4b and the lower surface of the strap-like cover ribbon 4a, according to the operation discussed below, the strap-like cover ribbon 4a, being stuck to the sticky tape 82, can be easily removed from the upper surface of the strap-like resin ribbon 4b. This will be discussed in detail below.

First, the second sticky-tape pressurizing unit 86 makes the pressurizing guide 86a move from a position P3 towards the position P4 in a direction substantially perpendicular to the direction of the ejection path of the sticky tape 82. This produces a force to pull back the sticky tape 82 which is pulled out by a predetermined amount through the vertical movement of the pressurizing body 84a, being bent, and consequently pressurized and bonded to the non-sticky surface of the strap-like cover ribbon 4a to the initial position P1, and through this pull-back operation, the strap-like cover ribbon 4a, being stuck to the sticky surface 82a, is removed from the upper surface of the strap-like resin ribbon 4b and the upper surface of the ribbon 4b is exposed.

After that, the second sticky-tape pressurizing unit 86 makes the pressurizing guide 86a return to the initial position P3, and accordingly the motor of the sticky-tape ejection unit 87 is driven by a predetermined amount to rotate the unit 87 clockwise by the predetermined amount and consequently the ejection unit 87 reels the sticky tape 82 of a predetermined amount corresponding to the amount pulled out from the sticky-tape supply unit 81 for removing the strap-like cover ribbon 4a, thereby completing a series of removing operation.

At this time, it is possible to control whether or not the sticky-tape ejection unit 87 should reel the sticky tape 82 by the predetermined amount, on the basis of the detection result of the cover-ribbon detection unit 85. Specifically, when the detection unit 85 does not detect the presence of the strap-like cover ribbon 4a to be transported, the unit 85 sends a signal indicating not-detection to the controller, and as a result, the controller recognizes occurrence of error in removing the strap-like cover ribbon 4a and controls the motor of the ejection unit 87 to stop the operation of the unit 87. This detection operation makes it possible to perform a stable operation of removing the strap-like cover ribbon.

(Variations of The First Preferred Embodiment)

Figure 6:
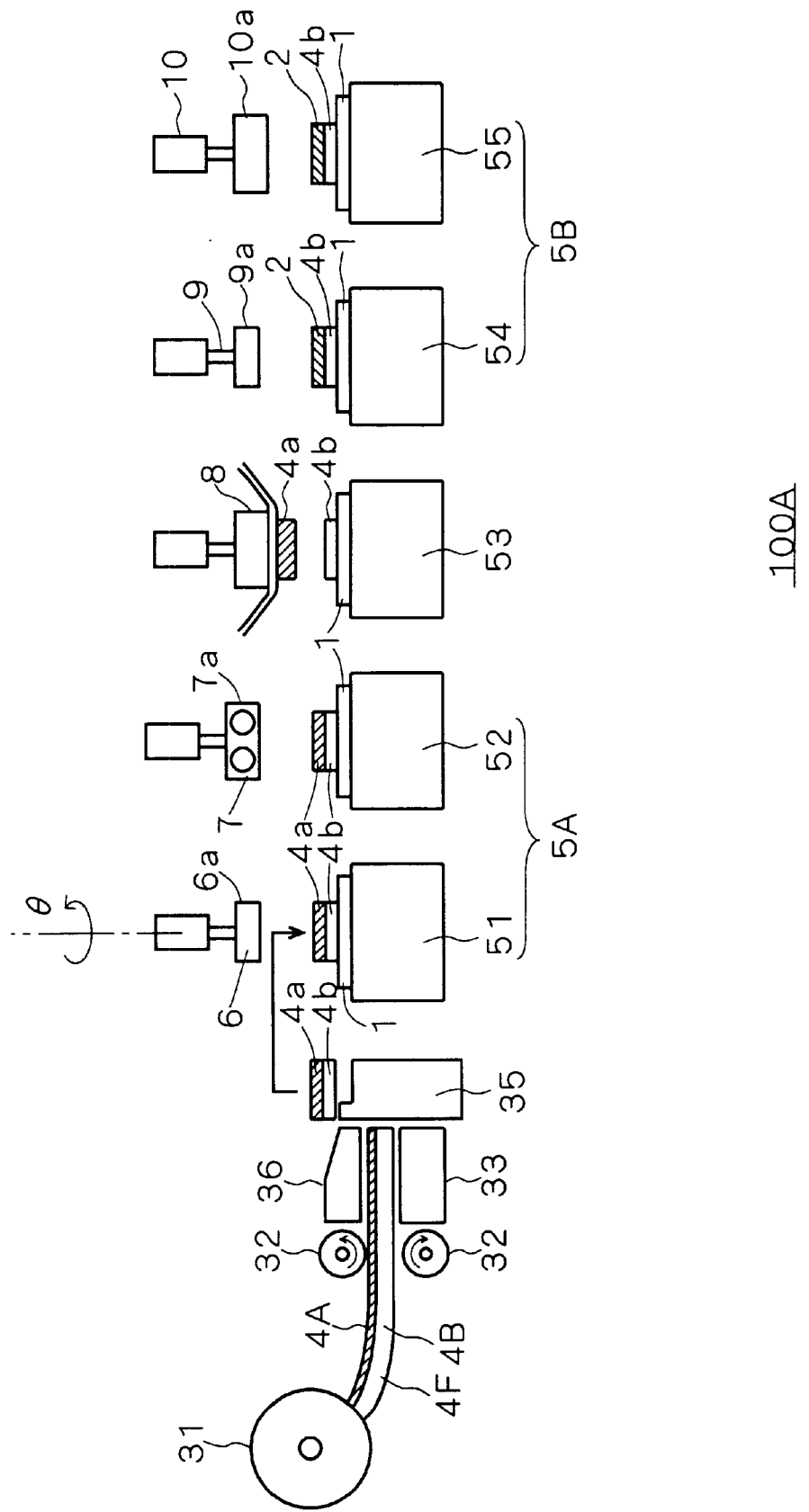
FIGS. 6 and 7 are views showing constitutions of die bonding devices in accordance with variations of the first preferred embodiment of the present invention.

(1) FIG. 6 shows a constitution of a die bonding device 100A used for a case where the resin film 4F wound around the supply reel 31 has a double-layered structure consisting of the resin ribbon 4B and the cover ribbon 4A formed on the upper surface thereof. The device 100A is different from the device 100 of FIG. 2 in that the winding reel 34 of FIG. 2 is unneeded as the winding ribbon 4C of FIG. 2 is not used and the winding guide 33 is only a block supporting the resin film 4F of double-layered structure without the curvature clearance 37 (of FIG. 3). That ensures simplification of the die bonding device to some extent.

Figure 7:
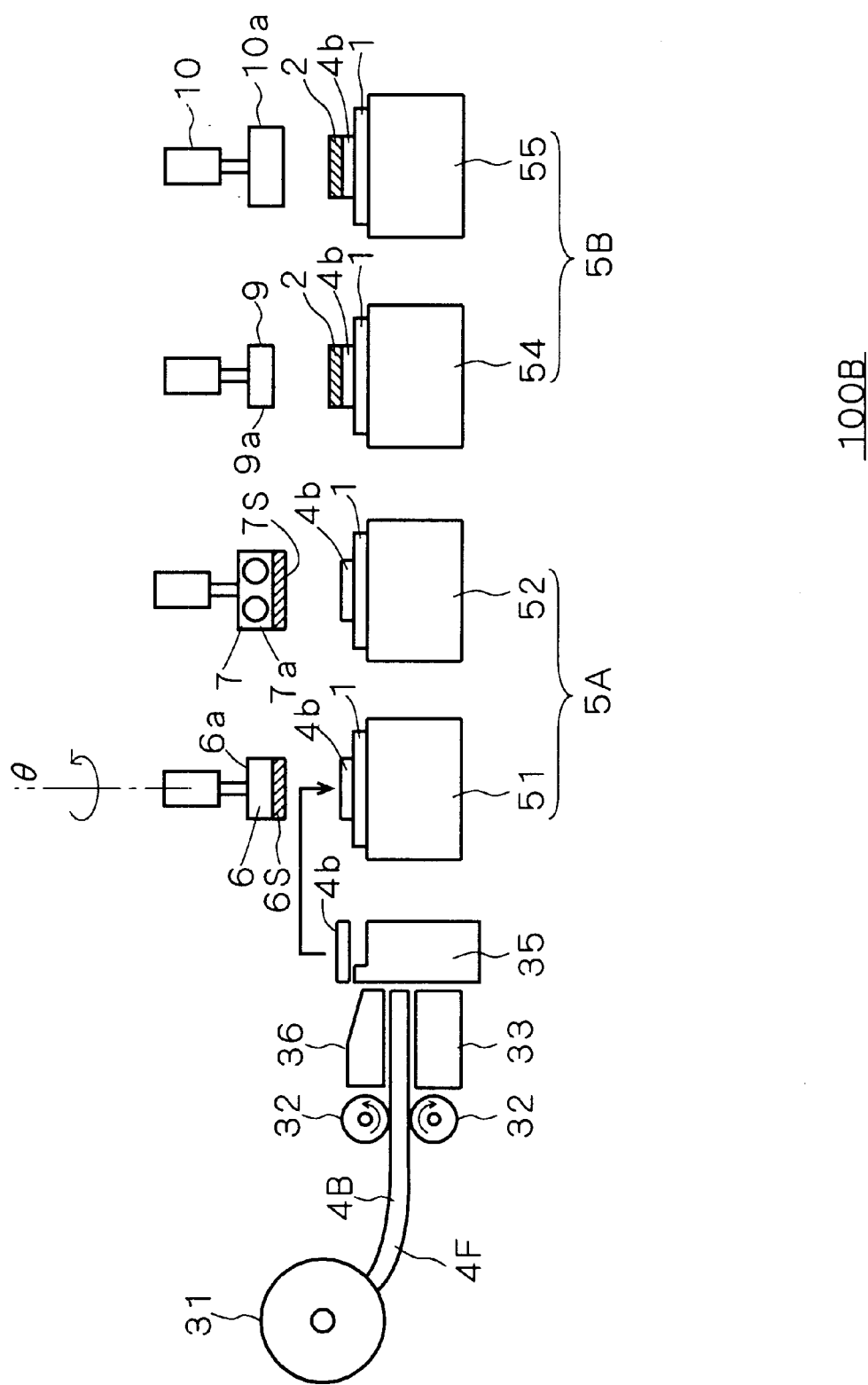
Figure 10:
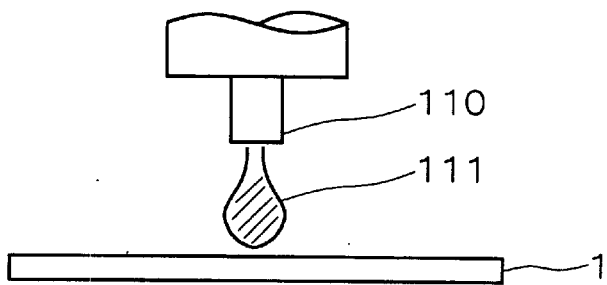
FIGS. 10 and 11 are cross sections each schematically showing a die bonding device in the prior art.
Figure 11:
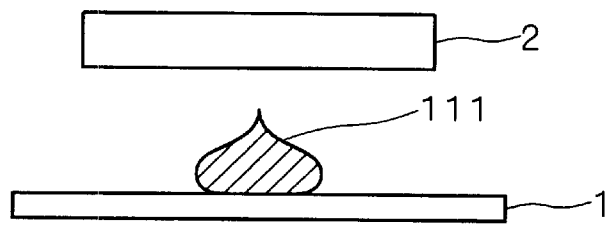
Figure 12:
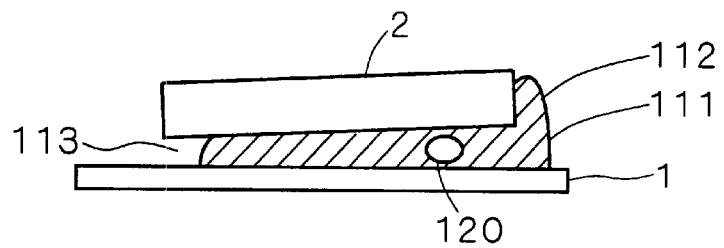
FIG. 12 is a cross section for pointing out problems which arise when the prior-art die bonding device is used.

(2) FIG. 7 shows a constitution of a die bonding device 100B used for a case where the resin film 4F wound around the supply reel 31 is made only of the resin ribbon 4B. In this variation, the resin ribbon 4B itself corresponds to "a resin having a stickiness on its back surface and a predetermined thickness." In this figure, reference numerals 6S and 7S are coated with e.g., Teflon and constitute a non-sticky surface. This does not cause the pressing surfaces 6S and 7S to be bonded to the ribbon 4b. This variation eliminates the necessity of the winding reel 34 of FIG. 2 and simplifies the constitution of the winding guide 33 like the variation (1), and moreover eliminates the necessity of the cover-ribbon removing unit 8 and the third heater 53 of FIG. 2 to ensure further simplification in constitution of the die bonding device.

(3) Though the first transporter 6 works as both a transport unit and a bonding unit in FIG. 2, this may be divided into two units which can be separately provided. The same variation can be applied to the second transporter 9 of FIG. 2.

(4) Though the lead frame 1 of FIGS. 2, 6 and 7 is transported to the respective predetermined positions of the upper surfaces of the heaters by the transport and positioning unit one by one, instead, after the strap-like resin film 4 after being cut is transported to the predetermined position of the upper surface of one heater, all the processes thereafter as discussed earlier may be performed on the predetermined position. In this case, the heater works as both the first and second heating units 5A and 5B and the third heater 53 of FIG. 2.

(The Second Preferred Embodiment)

In the example of FIG. 2 of the first preferred embodiment, though the chip 2 is bonded to the upper surface of the resin ribbon 4b and the second pressurizer 10 pressurizes the resin ribbon 4b and the chip 2 for each semiconductor chip 2, it is preferable that the last process by the second pressurizing unit 5B should be performed as batch processing frame by frame, not chip by chip, in terms of improvement in performance of the device. Moreover, in this case, such a batch processing is desirable also in terms of protection of chips since the load value to be applied can be reduced by the number of chips. Then, in the second preferred embodiment, the pressing portion of the second pressurizing unit 5B, i.e., the pressing portion 10a of the second pressurizer 10 has such shape and size as to collectively pressurize the surfaces of a plurality of chips 2 placed on the corresponding predetermined regions 1R of the lead flame 1 with the strap-like resin ribbons 4b interposed therebetween.

A constitutional example of the second pressurizer 10 is shown in a cross section of FIG. 8. In FIG. 8, reference numeral 11 denotes a guide and numeral 15 denotes a heater which corresponds to the fifth heater 55 of FIG. 1. Further, for the purpose of considering variation of a plurality of chips 2 in a direction of thickness in collective pressurization and protecting the surfaces of the chips 2, collective pressurization is performed with a ribbon-like or film-like interference material 14 having a predetermined elastic force in the direction of thickness interposed between the chips 2 and the pressing portion 10a. Reference numerals 12 and 13 denote reels round which the interference material 14 is wound.

As an example, assuming that ten chips 2 are collectively pressurized and each chip is a square of 10mm×10 mm, the pressing portion 10a applies a load of 98N for 1 second. Alternatively, the pressing portion 10a may press the chips 2 for 10 seconds with a load of 9.8 N for protection of the surfaces of the chips 2.

(The Third Preferred Embodiment)

The characteristic feature of the third preferred embodiment lies in that at least one of the pair of rollers 32 in the supply unit 3 of FIG. 1 is a metal roller provided with a plurality of protrusion needles each having such a length as to reach the sticky portion of the resin film at least and provide a microscopic hole therein. The other roller with no protrusion needle may be an elastic body such as a rubber roller, or a metal roller. When both rollers have the protrusion needles, it is necessary to adjust the positions of the protrusion needles of the rollers to each other. Except that, this preferred embodiment is not different from the first preferred embodiment, the variations thereof or the second preferred embodiment. An enlarged view of the supply unit 3 where this preferred embodiment is applied to the bonding device of FIG. 2 of the first preferred embodiment is shown in FIG. 9. It is natural that this preferred embodiment can be applied to the second preferred embodiment.

As shown in FIG. 9, the surface of the metal roller 32A is provided with a plurality of protrusion needles 32a. Each of the protrusion needles 32a has a length which is set at the maximum value such that its tip portion may go through from the cover ribbon 4A to almost the back surface of the resin ribbon 4B. It is natural that the length may be shorter, but should be long at least enough to provide a hole in the upper surface of the ribbon 4B. This structure can produce the following effect.

Providing the cover ribbon 4A and the resin ribbon 4B with microscopic holes 21 each having the same diameter as that of the protrusion needle 32a allows the void to be more quickly and reliably pushed out through the microscopic holes 21 used as an out in the later operations of bonding and pressurizing the strap-like resin ribbon 4b using the units 6, 7 and 5A of FIG. 1, thereby eliminating emergence of the void and its remainder. Moreover, this produces another effect of reducing the bonding time and pressurization time as compared with a case of no protrusion needle 32a. Additionally, since one of the rollers is metal, it is advantageously possible to reliably send the resin film 4F in the roller feed. Further, the strap-like resin ribbon 4b is melted by the heated temperature in bonding and pressurizing the chip 2, whereby the microscopic holes 21 disappears.

(Summary)

Thus, according to the first to third preferred embodiments, since the strap-like resin ribbon 4b cut in conformity with the size of the chip 2 is used when the chip 2 is bonded on the predetermined region 1R of the lead frame 1, no extending-off defect is produced, no void inside the strap-like resin ribbon 4b is produced, and a bonding material portion made of the strap-like resin ribbon 4b extending evenly in thickness between the chip 2 and the predetermined region 1R can be stably formed.

While the invention has been shown and described in detail, the foregoing description is in all aspects illustrative and not restrictive. It is therefore understood that numerous modifications and variations can be devised without departing from the scope of the invention.

What is claimed is:

1. A die bonding device comprising:

a supply unit configured to generate a strap-like resin film from a resin film having stickiness on its back surface and a predetermined thickness, said strap-like resin film having first and second widths in first and second directions, respectively, and said predetermined thickness;

a transport unit configured to transport said strap-like resin film to a predetermined region in a surface of a lead frame to bring said back surface of said strap-like resin film into contact with said predetermined region;

a heating unit configured to set the temperature of said strap-like resin film to be higher than the room temperature and below the transition temperature of said strap-like resin film; and a pressurizing unit having a pressing portion which is vertically movable, said pressurizing unit configured to pressurize said strap-like resin film from a surface thereof heated by said heating unit, with said pressing portion, to bond said back surface of said strap-like resin film to said predetermined region, wherein said predetermined region has said first and second widths in said first and second directions, respectively.

2. The die bonding device according to claim 1, wherein said resin film comprises a resin ribbon whose stickiness at said room temperature is lower than that at said transition temperature; and a cover ribbon layered on a surface of said resin ribbon and having a surface of non-stickiness, said strap-like resin film comprises a strap-like resin ribbon; and a strap-like cover ribbon layered on a surface of said strap-like resin ribbon, and said pressing portion of said pressurizing unit pressurizes a surface of said strap-like cover ribbon layered on said surface of said strap-like resin ribbon whose temperature is set to be higher than said room temperature and below said transition temperature of said strap-like resin ribbon, to bond a back surface of said strap-like resin ribbon to said predetermined region, defining said transport unit, said heating unit, said pressurizing unit and said pressing portion as a first transport unit, a first heating unit, a first pressurizing unit and a first pressing portion, respectively, said die bonding device further comprising:

a removing unit configured to remove only said strap-like cover ribbon included in said strap-like resin film in which said back surface of said strap-like resin ribbon is bonded to said predetermined region;

a second heating unit configured to set the temperature of said strap-like resin ribbon in a predetermined temperature range including said transition temperature of said strap-like resin ribbon;

a second transport unit configured to transport a semiconductor chip having said first and second widths in said first and second directions, respectively, onto said surface of said strap-like resin ribbon without said strap-like cover ribbon; and a second pressurizing unit having a second pressing portion which is vertically movable, said second pressurizing unit configured to pressurize said strap-like resin ribbon heated by said second heating unit and said semiconductor chip transported onto said surface of said strap-like resin ribbon from a surface of said semiconductor chip with said second pressing portion, to bond a back surface of said semiconductor chip to said surface of said strap-like resin ribbon.

3. The die bonding device according to claim 1, wherein said resin film is made of a resin ribbon whose stickiness at said room temperature is lower than that at said transition temperature, said strap-like resin film is made of a strap-like resin ribbon, and said pressing portion of said pressurizing unit has a pressing surface of non-stickiness and pressurizes a surface of said strap-like resin ribbon whose temperature is set to be higher than said room temperature and below said transition temperature of said strap-like resin ribbon by said heating unit, with said pressing surface interposed, to bond a back surface of said strap-like resin ribbon to said predetermined region.

4. The die bonding device according to claim 3, wherein defining said transport unit, said heating unit, said pressurizing unit and said pressing portion as a first transport unit, a first heating unit, a first pressurizing unit and a first pressing portion, respectively, said die bonding device further comprising:

a second heating unit configured to set the temperature of said strap-like resin ribbon in a predetermined temperature range including said transition temperature of said strap-like resin ribbon;

a second transport unit configured to transport a semiconductor chip having said first and second widths in said first and second directions, respectively, onto said surface of said strap-like resin ribbon; and a second pressurizing unit having a second pressing portion which is vertically movable, said second pressurizing unit configured to pressurize said strap-like resin ribbon heated by said second heating unit and said semiconductor chip transported onto said surface of said strap-like resin ribbon from a surface of said semiconductor chip with said second pressing portion, to bond a back surface of said semiconductor chip to said surface of said strap-like resin ribbon.

5. The die bonding device according to claim 2, wherein said second pressing portion of said second pressurizing unit has such shape and size as to collectively pressurize surfaces of a plurality of semiconductor chips each transported onto said surface of said strap-like resin ribbon corresponding thereto by said second transport unit.

6. The die bonding device according to claim 5, wherein said second pressurizing unit further comprises an interference material of non-stickiness, having a predetermined elastic force in a direction of thickness and provided between the position of said second pressing portion before pressurization and said surfaces of said plurality of semiconductor chips, and said second pressing portion of said second pressurizing unit pressurizes said surfaces of said plurality of semiconductor chips with said interference material interposed.

7. The die bonding device according to claim 4, wherein said second pressing portion of said second pressurizing unit has such shape and size as to collectively pressurize surfaces of a plurality of semiconductor chips each transported onto said surface of said strap-like resin ribbon corresponding thereto by said second transport unit.

8. The die bonding device according to claim 7, wherein said second pressurizing unit further comprises an interference material of non-stickiness, having a predetermined elastic force in a direction of thickness and provided between the position of said second pressing portion before pressurization and said surfaces of said plurality of semiconductor chips, and said second pressing portion of said second pressurizing unit pressurizes said surfaces of said plurality of semiconductor chips with said interference material interposed.

9. The die bonding device according to claim 2, wherein said removing unit has a flexible body having a first surface of stickiness and a second surface of non-stickiness opposed to said first surface, said flexible body provided above said strap-like ribbon, said removing unit configured to bend said flexible body to bond said first surface and said surface of said strap-like cover ribbon and forcedly return said bent flexible body to the initial position to remove said strap-like cover ribbon.

10. The die bonding device according to claim 1, wherein said supply unit comprises a pair of rollers configured to hold said resin film; and a blade portion positioned in a direction of sending said resin film through an operation of said pair of rollers, said blade portion configured to cut an edge portion of said resin film of a predetermined length sent through said operation of said pair of rollers to obtain said strap-like resin film, and wherein at least one of said pair of rollers is a metal roller provided with a plurality of protrusion needles each having such a length as to reach a sticky portion of said resin film.

11. A die bonding device comprising:

supply means for generating a strap-like resin film from a resin film having stickiness on its back surface and a predetermined thickness, said strap-like resin film having first and second widths in first and second directions, respectively, and said predetermined thickness;

transport means for transporting said strap-like resin film to a predetermined region in a surface of a lead frame to bring said back surface of said strap-like resin film into contact with said predetermined region;

heating means for setting the temperature of said strap-like resin film to be higher than the room temperature and below the transition temperature of said strap-like resin film; and pressurizing means having a pressing portion which is vertically movable, said pressurizing means for pressurizing said strap-like resin film from a surface thereof heated by said heating means, with said pressing portion, to bond said back surface of said strap-like resin film to said predetermined region, wherein said predetermined region has said first and second widths in said first and second directions, respectively.

12. The die bonding device according to claim 11, wherein said resin film comprises a resin ribbon whose stickiness at said room temperature is lower than that at said transition temperature; and a cover ribbon layered on a surface of said resin ribbon and having a surface of non-stickiness, said strap-like resin film comprises a strap-like resin ribbon; and a strap-like cover ribbon layered on a surface of said strap-like resin ribbon, and said pressing portion of said pressurizing means pressurizes a surface of said strap-like cover ribbon layered on said surface of said strap-like resin ribbon whose temperature is set to be higher than said room temperature and below said transition temperature of said strap-like resin ribbon, to bond a back surface of said strap-like resin ribbon to said predetermined region, defining said transport means, said heating means, said pressurizing means and said pressing portion as first transport means, first heating means, first pressurizing means and a first pressing portion, respectively, said die bonding device further comprising:

removing means for removing only said strap-like cover ribbon included in said strap-like resin film in which said back surface of said strap-like resin ribbon is bonded to said predetermined region;

second heating means for setting the temperature of said strap-like resin ribbon in a predetermined temperature range including said transition temperature of said strap-like resin ribbon;

second transport means for transporting a semiconductor chip having said first and second widths in said first and second directions, respectively, onto said surface of said strap-like resin ribbon without said strap-like cover ribbon; and second pressurizing means having a second pressing portion which is vertically movable, said second pressurizing means for pressurizing said strap-like resin ribbon heated by said second heating means and said semiconductor chip transported onto said surface of said strap-like resin ribbon from a surface of said semiconductor chip with said second pressing portion, to bond a back surface of said semiconductor chip to said surface of said strap-like resin ribbon.

13. The die bonding device according to claim 11, wherein said resin film is made of a resin ribbon whose stickiness at said room temperature is lower than that at said transition temperature, said strap-like resin film is made of a strap-like resin ribbon, and said pressing portion of said pressurizing means has a pressing surface of non-stickiness and pressurizes a surface of said strap-like resin ribbon whose temperature is set to be higher than said room temperature and below said transition temperature of said strap-like resin ribbon by said heating means, with said pressing surface interposed, to bond a back surface of said strap-like resin ribbon to said predetermined region.

14. The die bonding device according to claim 13, wherein defining said transport means, said heating means, said pressurizing means and said pressing portion as first transport means, first heating means, first pressurizing means and a first pressing portion, respectively, said die bonding device further comprising:

second heating means for setting the temperature of said strap-like resin ribbon in a predetermined temperature range including said transition temperature of said strap-like resin ribbon;

second transport means for transporting a semiconductor chip having said first and second widths in said first and second directions, respectively, onto said surface of said strap-like resin ribbon; and second pressurizing means having a second pressing portion which is vertically movable, said second pressurizing means for pressurizing said strap-like resin ribbon heated by said second heating means and said semiconductor chip transported onto said surface of said strap-like resin ribbon from a surface of said semiconductor chip with said second pressing portion, to bond a back surface of said semiconductor chip to said surface of said strap-like resin ribbon.

15. The die bonding device according to claim 12, wherein said second pressing portion of said second pressurizing means has such shape and size as to collectively pressurize surfaces of a plurality of semiconductor chips each transported onto said surface of said strap-like resin ribbon corresponding thereto by said second transport means.

16. The die bonding device according to claim 15, wherein said second pressurizing means further comprises an interference material of non-stickiness, having a predetermined elastic force in a direction of thickness and provided between the position of said second pressing portion before pressurization and said surfaces of said plurality of semiconductor chips, and said second pressing portion of said second pressurizing means pressurizes said surfaces of said plurality of semiconductor chips with said interference material interposed.

17. The die bonding device according to claim 14, wherein
said second pressing portion of said second pressurizing means has such shape and size as to collectively pressurize surfaces of a plurality of semiconductor chips each transported onto said surface of said strap-like resin ribbon corresponding thereto by said second transport means.

18. The die bonding device according to claim 17, wherein
said second pressurizing means further comprises an interference material of non-stickiness, having a predetermined elastic force in a direction of thickness and provided between the position of said second pressing portion before pressurization and said surfaces of said plurality of semiconductor chips, and
said second pressing portion of said second pressurizing means pressurizes said surfaces of said plurality of semiconductor chips with said interference material interposed.

19. The die bonding device according to claim 12, wherein
said removing means has a flexible body having a first surface of stickiness and a second surface of non-stickiness opposed to said first surface, said flexible body provided above said strap-like ribbon, said removing means for bending said flexible body to bond said first surface and said surface of said strap-like cover ribbon and forcedly return said bent flexible body to the initial position to remove said strap-like cover ribbon.

* * * * *